United States Patent
Murayama et al.

(10) Patent No.: US 8,350,390 B2
(45) Date of Patent: Jan. 8, 2013

(54) WIRING SUBSTRATE AND SEMICONDUCTOR DEVICE

(75) Inventors: Kei Murayama, Nagano (JP); Masahiro Sunohara, Nagano (JP); Akinori Shiraishi, Nagano (JP); Hideaki Sakaguchi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 96 days.

(21) Appl. No.: 12/958,730

(22) Filed: Dec. 2, 2010

(65) Prior Publication Data

US 2011/0147951 A1   Jun. 23, 2011

(30) Foreign Application Priority Data

Dec. 18, 2009   (JP) .................................. 2009-287132

(51) Int. Cl.
*H01L 23/52* (2006.01)
*H01L 23/44* (2006.01)
*H01L 29/40* (2006.01)

(52) U.S. Cl. ......... 257/774; 257/692; 257/736; 257/773

(58) Field of Classification Search .................. 257/692, 257/736, 773, 774
See application file for complete search history.

(56) References Cited

U.S. PATENT DOCUMENTS

| 6,633,087 | B2 * | 10/2003 | Ker et al. | 257/786 |
| 6,803,664 | B2 | 10/2004 | Murayama | |
| 6,835,597 | B2 | 12/2004 | Murayama | |
| 6,844,631 | B2 * | 1/2005 | Yong et al. | 257/786 |
| 6,858,885 | B2 * | 2/2005 | Ebara | 257/173 |
| 7,755,195 | B2 * | 7/2010 | Ueda | 257/758 |
| 2004/0070041 | A1 * | 4/2004 | Obayashi et al. | 257/437 |
| 2007/0052068 | A1 * | 3/2007 | Takemura et al. | 257/637 |

FOREIGN PATENT DOCUMENTS

| JP | 2002-329802 A1 | 11/2002 |
| JP | 2008-112765 A1 | 5/2008 |

\* cited by examiner

*Primary Examiner* — Luan C Thai
(74) *Attorney, Agent, or Firm* — Kratz, Quintos & Hanson, LLP

(57) ABSTRACT

A wiring substrate includes a wiring layer, an insulating layer formed on the wiring layer, a connection pad formed on the insulating layer, and a via conductor formed to penetrate the insulating layer, and connecting the wiring layer and the connection pad, wherein the wiring layer located under the connection pad is formed to have via receiving electrode portion whose area is smaller than an area of the connection pad, and a wiring portion separated from the via receiving electrode portion, in an area corresponding to the connection pad, and the via receiving electrode portion is connected to the connection pad via the via conductor.

8 Claims, 4 Drawing Sheets

WIRING SUBSTRATE AND SEMICONDUCTOR DEVICE

CROSS-REFERENCE TO RELATED APPLICATIONS

This application is based upon and claims the benefit of priority of the prior Japanese Patent Application No. 2009-287132, filed on Dec. 18, 2009; the entire contents of which are incorporated herein by reference.

FIELD

It is related to a wiring substrate and a semiconductor device.

BACKGROUND

In the prior art, there is the wiring substrate (semiconductor package) for mounting the semiconductor chip thereon. The wiring substrate is constructed such that the build-up wiring is formed on both surface sides of the core substrate.

In Patent Literature 1 (Japanese Laid-Patent Publication No. 2008-112765), it is set forth that mechanical strength of the portions located at four corners of the substrate should be improved by replacing a plurality of metal lands arranged at four corners of the wiring substrate conventionally with one integrated metal land.

Also, in Patent Literature 2 (Japanese Laid-Patent Publication No. 2002-329802), it is set forth that, in the semiconductor package, the pad to which each external connection terminal (pin) is connected is divided into a plurality of pads, and then the wiring connected to another pad is arranged between the pads which are arranged to be divided.

As explained in the column of the related art described later, in the wiring substrate on which the semiconductor chip is mounted, there is such a tendency that a design rule applied to the wiring layer located under the upper surface layer is reduced to the utmost extent.

In the wiring substrate, one via conductor connected to a main portion of the connection pad is arranged under each connection pad, and the via conductor is arranged on the via pad, which is arranged with the equal area to the connection pad, of the lower wiring layer, thus the interlayer connection is provided.

In a situation that a further increase in a wiring density of the lower wiring layers (an increase in the number of wirings) is demanded, a narrower pitch of the lower wiring layers can be implemented by introducing the high-level photolithography technology. In this case, a huge capital investment and a change in process are needed, and therefore such introduction cannot be easily applied in actuality. As a result, a minimum design rule is decided depending on whether or not how many wirings can be arranged between the via pads of the lower wiring layer by the existing photolithography technology.

Also, in the related art, the via pads of the lower wiring layer are arranged in a size which corresponds to the connection pad. Therefore, the presence of the via pads inhibits an increase in a wiring density of the lower wiring layers.

SUMMARY

According to one aspect discussed herein, there is provided a wiring substrate, including a wiring layer, an insulating layer formed on the wiring layer, a connection pad formed on the insulating layer, and a via conductor formed to penetrate the insulating layer, and connecting the wiring layer and the connection pad, wherein the wiring layer located under the connection pad by one layer is formed to have via receiving electrode portion whose area is smaller than an area of the connection pad, and a wiring portion separated from the via receiving electrode portion, to an area corresponding to the connection pad, and the via receiving electrode portion is connected to the connection pad via the via conductor.

DESCRIPTION OF EMBODIMENT

An embodiment of the present invention will be explained with reference to the accompanying drawings hereinafter.

Related Art

Figure 1:
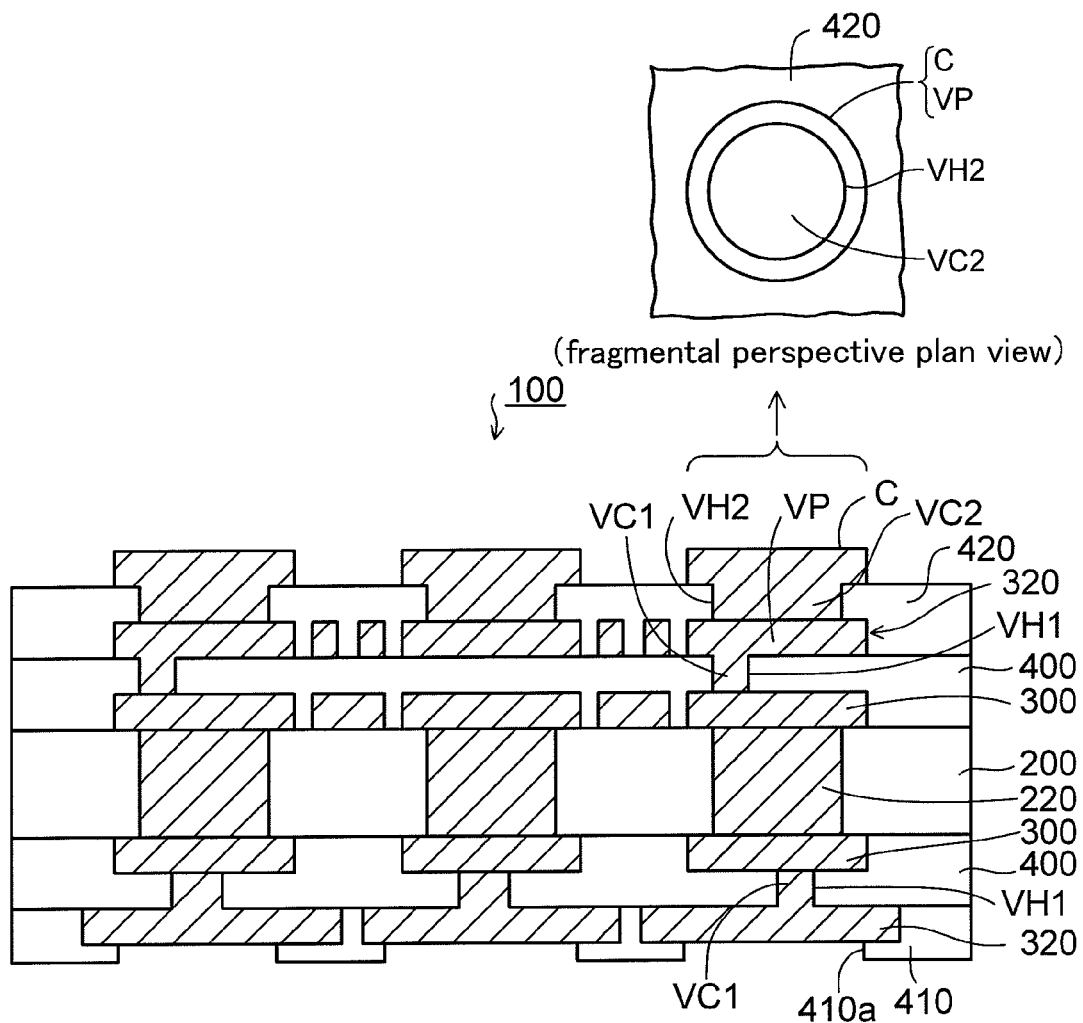
FIG. 1 is a sectional view depicting a wiring substrate in the related art associated with an embodiment.

Prior to the explanation of embodiments, the related art (preliminary matter) will be explained hereunder. FIG. 1 is a sectional view depicting a wiring substrate in the related art.

As depicted in FIG. 1, in a wiring substrate 100 in the related art, penetrating electrodes 220 which penetrate a core substrate 200 in the thickness direction are formed in the core substrate 200. First wiring layers 300 connected mutually via the penetrating electrode 220 are formed on both surface sides of the core substrate 200 respectively.

First interlayer insulating layers 400 are formed on the first wiring layers 300 on both surface sides of the core substrate 200 respectively. First via holes VH1 each reaching the first wiring layer 300 are formed in the first interlayer insulating layers 400 on both surface sides of the core substrate 200 respectively.

Second wiring layers 320 each connected to the first wiring layer 300 via a via conductor VC1 filled in the first via hole VH1, are formed on the first interlayer insulating layers 400 on both surface sides of the core substrate 200 respectively. A solder resist 410 in which an opening portion 410a is provided on connection parts of the second wiring layer 320 respectively is formed on the lower surface side of the core substrate 200.

The second wiring layer 320 formed on the upper surface side of the core substrate 200 has a via pad VP in its one end part.

Also, a second interlayer insulating layer 420 is formed on the second wiring layer 320 on the upper surface side of the core substrate 200. Second via holes VH2 each reaching the via pad VP of the second wiring layer 320 are formed in the second interlayer insulating layer 420.

Connection pads C each connected to the via pad VP of the second wiring layer 320 via a via conductor VC2 filled in the second via hole VH2, are formed on the second interlayer insulating layer 420.

Further, by reference to the fragmental perspective plan views in FIG. 1, in the wiring substrate 100 in the related art, one via conductor VC2 connected to a main portion of the connection pad C is arranged under each connection pad C, and the via conductor VC2 is arranged on the via pads VP of the second wiring layers 320 respectively, thus the interlayer connection is provided. That is, the via pad VP having a size corresponding to the connection pad C (equal area) so as to receive the via conductor VC2 is provided to the second wiring layer 320 located under the connection pad C.

Also, the semiconductor chip is flip-chip connected to the connection pads C of the wiring substrate 100. In such wiring substrate 100, there is such a tendency that a design rule applied to the second wiring layer 320 (the lower wiring layer) located under the connection pad C is reduced to the utmost extent.

In a situation that an increase in a wiring density of the second wiring layers 320 (an increase in the number of wirings) is demanded, the number of wirings can be increased by applying a narrower pitch of the second wiring layers 320, which can be implemented by introducing the high-level photolithography technology. In this case, a huge capital investment and a change in process are needed, and therefore such introduction cannot be easily applied in actuality.

In this manner, a minimum design rule is decided depending on whether or not how many wirings can be arranged between the via pads VP of the second wiring layers 320 by the existing photolithography technology in the process. Therefore, there is such a problem that cannot easily deal with an increase of a wiring density.

Also, in the related art, the via pad VP of the second wiring layer 320 is arranged in a relatively large area that corresponds to the connection pad C. Therefore, the presence of the via pads VP inhibits an increase in a wiring density of the second wiring layers 320.

As the result of an earnest study done in view of the above problem, the inventor of this application developed such a new wiring structure that is capable of increasing a wiring density of the wiring layers located under the connection pads without the introduction of a high-level photolithography technology.

Embodiment

Figure 2:
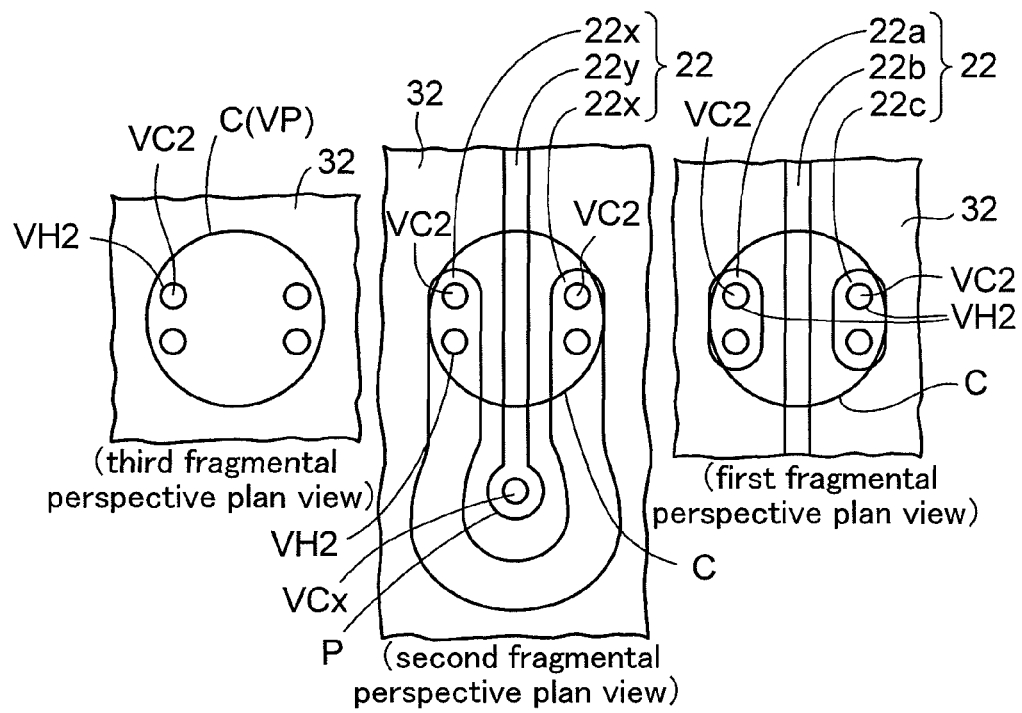
FIG. 2 is a sectional view and fragmental perspective plan views depicting a wiring substrate according to an embodiment.
Figure 2:
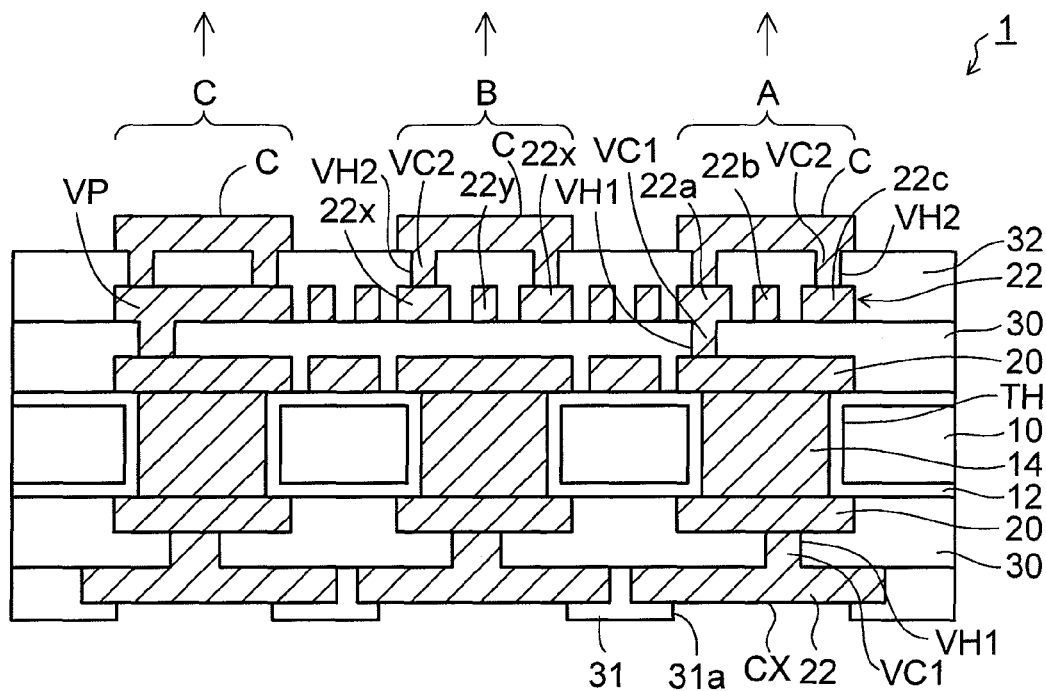

FIG. 2 is a sectional view and fragmental perspective plan views depicting a wiring substrate according to an embodiment.

As depicted in FIG. 2, in a wiring substrate 1 of the present embodiment, a silicon substrate 10 whose thickness is about 200 μm is used as the core substrate, and through holes TH which penetrate to the thickness direction of the silicon substrate 10 are provided in the silicon substrate 10. Insulating layers 12 formed of a silicon oxide layer are formed on both surfaces of the silicon substrate 10 and inner surfaces of the through holes TH.

The silicon oxide layer is formed by thermally oxidizing the silicon substrate 10 in which the through holes TH are formed, or the silicon oxide layer is formed on both surfaces of the silicon substrate 10 and inner surfaces of the through holes TH by the CVD method, so that the insulating layer 12 is obtained. In place of the silicon oxide layer, a silicon nitride layer or a silicon oxide/nitride layer may be formed as the insulating layer 12.

Also, a penetrating electrode 14 is filled in the through holes TH of the silicon substrate 10 respectively. As the method of forming the penetrating electrode 14, first, the silicon substrate 10 in which the through holes TH are provided and on the whole surface of which the insulating layer 12 is formed is arranged on a plating power feeding material (a copper foil, or the like). Then, a copper plating layer is filled in the through holes TH toward their upper parts from their bottom parts respectively by the electroplating utilizing the plating power feeding material as a plating power feeding path, and thus the penetrating electrodes 14 are obtained.

As the preferable example of the substrate, the silicon substrate 10 that the micro-fabrication is possible is enumerated. In this case, an insulating substrate such as a ceramics substrate, a resin substrate, or the like may be employed. In the case that the insulating substrate is employed, the insulating layer 12 is omitted.

Also, first wiring layers 20 connected mutually via the penetrating electrode 14 are formed on both surface sides of the silicon substrate 10 respectively. As an example of the wiring structure of the first wiring layer 20, a stacked metal film formed of a titanium (Ti) layer (thickness: 0.05 μm)/a first copper (Cu) layer (thickness: 0.2 μm)/a second copper (Cu) layer (thickness: 2 μm) in order from the bottom is employed.

As the method of forming the first wiring layer 20, first, a seed layer (not shown) constructed by a Ti layer (thickness: 0.05 μm)/a first Cu layer (thickness: 0.2 μm) is formed on the silicon substrate 10 by the sputter method. Then, a plating resist (not shown) in which an opening portion is provided on the parts where the first wiring layer 20 is arranged respectively is formed on the seed layer.

Then, a copper plating layer (thickness: 2 μm) is formed as the second Cu layer in the opening portions of the plating resist by the electroplating utilizing the seed layer as the plating power feeding path. Then, the plating resist is removed, and then the first wiring layers 20 are obtained by etching the seed layer using the copper plating layer as a mask.

Also, a first interlayer insulating layer 30 covering the first wiring layers 20 is formed on both surface sides of the silicon substrate 10 respectively. The first interlayer insulating layer is formed by thermo-compression bonding a resin sheet made of an epoxy resin, a polyimide resin, or the like onto the silicon substrate 10. Alternatively, a liquid resin may be coated on the silicon substrate 10 and then be cured. Otherwise, the first interlayer insulating layer 30 may be formed by forming an inorganic insulating film such as a silicon oxide layer, or the like by means of the CVD method.

Then, first via holes VH1 each reaching the first wiring layer 20 are formed in the first interlayer insulating layer 30 both surface sides of the silicon substrate 10 respectively. The first via holes VH1 are formed by the laser or the dry etching.

Also, second wiring layers 22 each connected to the first wiring layer 20 via a via conductor VC1 filled in the first via hole VH1 are formed on the first interlayer insulating layer 30 on both surface sides of the silicon substrate 10 respectively. The second wiring layers 22 are formed of the stacked metal film that is similar to the first wiring layer 20.

As the method of forming the second wiring layers 22, although not particularly shown, first, a seed layer made of copper, or the like is formed on the first interlayer insulating layer 30 and the inner surfaces of the first via holes VH1. Then, a plating resist (not shown) in which an opening portion is provided in the parts where the second wiring layer 22 is arranged respectively (containing the first via holes VH1) is formed.

Then, a copper plating layer is filled from the first via holes VH1 toward the opening portions in the plating resist by the electroplating utilizing the seed layer as the plating power feeding path. Then, the plating resist is removed, and then the second wiring layers 22 are obtained by etching the seed layer while using the copper plating layer as a mask.

Also, a solder resist 31 in which an opening portion 31a is provided on the connection parts of the second wiring layers 22 respectively is formed on the lower surface side of the silicon substrate 10. Then, the connection parts of the second wiring layer 22 on the lower surface side of the silicon substrate 10 function as external connection pads CX (lands).

Also, a second interlayer insulating layer 32 is formed on the second wiring layer 22 on the upper surface side of the silicon substrate 10. Then, second via holes VH2 each reaching the second wiring layer 22 are formed in the second interlayer insulating layer 32.

Also, connection pads C each connected to the second wiring layer 22 via a via conductor VC2 filled in the first via hole VH2 are formed on the second interlayer insulating layer 32 on the upper surface side of the silicon substrate 10. The via conductors VC2 and the connection pads C connected to the via conductors VC2 are formed while filling the second via hole VH2 by the electroplating, like the above second wiring layers 22.

Here, the wiring structure from the connection pad C to the second wiring layer 22 under the connection pad C in an A area in FIG. 2 will be explained hereunder. By further reference to the first fragmental perspective plan view, in the area that corresponds to the connection pad C, the second wiring layer 22 located under the connection pad C in the A area is formed to have first and second via receiving electrode portions 22a, 22c arranged on both end sides and a wiring portion 22b arranged in the center part.

That is, the first and second via receiving electrode portions 22a, 22c are arranged to be separated on both end sides of the area that corresponds to the connection pad C, and the wiring portion 22b is arranged between the first and second via receiving electrode portions 22a, 22c. The first and second via receiving electrode portions 22a, 22c are arranged with a width that is narrower (with area that is smaller) than the connection pad C, and the wiring portion 22b is arranged in the extra area. The wiring portion 22b is arranged to pass through the area that corresponds to the connection pad C, and then is extended outwardly from this area.

Then, the via conductor VC2 is filled in two second via holes VH2 which are arranged on the first and second via receiving electrode portions 22a, 22c respectively. Accordingly, the first via receiving electrode portion 22a is connected to the upper connection pad C by two separated via conductors VC2.

Similarly, the second via receiving electrode portion 22c is also connected to the upper connection pad C by two separated via conductors VC2. The first via receiving electrode portion 22a is connected to the first wiring layer 20 by the via conductor VC1 (a sectional view in FIG. 2) which is arranged under the first via receiving electrode portion 22a.

Although not particularly shown, similarly the second via receiving electrode portion 22c is connected to the first wiring layer 20 by the via conductor arranged under the second via receiving electrode portion 22c.

Also, the wiring portion 22b of the second wiring layer 22 is connected to the first wiring layer 20 and other connection pads by the via conductors arranged to the upper and lower side.

In this manner, in the present embodiment, the via conductor connected to a main portion of the connection pad C, and the via pad for receiving the via conductor and has an equal area to that of the connection pad C, are not provided under the connection pad C, but the via receiving electrode portions 22a, 22c whose width is narrower than the connection pad C are arranged. As a result, the extra area under the connection pad C can be utilized as the wiring area for arranging the wiring portion 22b of the second wiring layer 22.

In this way, the wiring portion 22b which is not connected to the connection pad C can be arranged on the area corresponding to the connection pad C. The first and second via receiving electrode portions 22a, 22c and the wiring portion 22b of the second wiring layer 22 and the second via holes VH2 are designed that can be patterned by the existing photolithography technology in the process. For example, in the case that a diameter of the connection pad C is set to 25 to 30 μm, respective widths of the first and second via receiving electrode portions 22a, 22c and the wiring portion 22b are set to about 2 to 5 μm.

Accordingly, the number of wirings in the second wiring layer 22 can be increased without changing a design rule by introducing the high-level photolithography technology, and thus a wiring density can be improved.

The first and second via receiving electrode portions 22a, 22c connected to the connection pad C and the wiring portion 22b can be arranged by a combination of the power line and the ground line, the power line and the signal line, or the ground line and the signal, otherwise a combination of the different type signal lines, or the like.

Next, the wiring structure from the connection pad C to the second wiring layer 22 under the connection pad C in a B area in FIG. 2 will be explained hereunder. By further reference to the second fragmental perspective plan view, in the area that corresponds to the connection pad C, the second wiring layer 22 located under the connection pad C in the B area is formed to have via receiving electrode portions 22x arranged on both end sides and a wiring portion 22y arranged in the center part.

Two via receiving electrode portions 22x arranged on both end sides of the area that corresponds to the connection pad C are extended outwardly from that area, and are formed to be connected like a U-shape together on the first interlayer insulating layer 30. That is, both terminal end sides of the via receiving electrode portions 22x formed like a U-shape are arranged in the area that corresponds to the connection pad C.

Like the above A area, the via receiving electrode portion 22x is formed in the area corresponding to the connection pad C with a width that is narrower (with an area that is smaller) than the connection pad C, and the wiring portion 22y is arranged in the extra area. Then, two via conductors VC2 are arranged on the via receiving electrode portions 22x, which are arranged on both end sides of the area that corresponds to the connection pad C.

Accordingly, the via receiving electrode portions 22x of the second wiring layer 22 are connected to the upper connection pad C by four via conductors VC2. Although not particularly shown, the via receiving electrode portions 22x of the second wiring layer 22 are connected to the first wiring layer 20 by the via conductor arranged under the via receiving electrode portions 22x.

The wiring portion 22y of the second wiring layer 22 is arranged between the via receiving electrode portions 22x (on the inner side) in a state that this wiring portion 22y passes through the area that corresponds to the connection pad C and is extended outwardly from that area. Also, the wiring portion 22y has a pad P (the second fragmental perspective plan view) outside of the area that corresponds to the connection pad C (the inside of the U-shaped via receiving electrode portions 22x).

Then, the wiring portion 22y of the second wiring layer 22 is connected to the first wiring layer 20 by a via conductor VCx arranged under the pad P thereof. Also, the wiring portion 22y of the second wiring layer 22 is connected to another connection pad by the via conductor (not shown) arranged on the wiring portion 22y.

In the foregoing A area and B area, the via receiving electrode portions 22a, 22C (22x) whose width is narrower than that of the connection pad C are formed on both end sides of the area that corresponds to the connection pad C. Thus, the wiring area for arranging the wiring portion 22b (22y) is ensured.

It can not limited to this mode, a total area of the via receiving electrode portions of the second wiring layer 22 may be set smaller than an area of the connection pad C such that the wiring portion of the second wiring layer 22 can pass through the area that corresponds to the connection pad C. Therefore, a shape, an arrangement position, and an area (width) of the via receiving electrode portion can be set arbitrarily. Also, the number of via conductors arranged on the via receiving electrode portion can be set arbitrarily (1 or more).

Next, the wiring structure from the connection pad C (another connection pad) to the second wiring layer 22 in a C area in FIG. 2 will be explained hereunder. The connection pad C in the C area is another connection pad that is formed of the same layer with the connection pads C in the A area and the B area. By further reference to the third fragmental perspective plan view, the C area indicates the area where there is no need to arrange the wiring portion of the second wiring layer 22 in the area that corresponds to the connection pad C, and a via pad VP of the second wiring layer 22 which has a size (equal area) corresponding to the connection pad C, is arranged to the area that corresponds to the connection pad C.

Then, four via conductors VC2 are arranged to be separated on the via pad VP of the second wiring layer 22. Then, the via pad VP of the second wiring layer 22 is connected to the connection pad C (another connection pad) by four via conductors VC2.

As described above, the connection pads C are formed while filling the second via holes VH2 by the electroplating. Therefore, from a viewpoint of stability of the process, all of second via holes VH2 are set to the same diameter with the second via holes VH2 in the A area and the B area.

As a result, in the C area in FIG. 2, a plurality of via conductors VC2 arranged on the via pad VP of the second wiring layer 22 being arranged in the area that corresponds to the connection pad C are formed in the same diameter with the via conductors VC2 in the A area and the B area.

The number of the via conductors VC2 arranged on the via pad VP of the second wiring layer 22 is adjusted appropriately to the area of the via pad VP and the diameter of the via conductor VC2 (the second via hole VH2).

As explained above, in the wiring substrate of the present embodiment, as for the second wiring layer 22 located under the connection pad C on the upper surface side, the integrated via pad is not arranged in the area corresponding to the connection pad C but the via receiving electrode portions 22a, 22C (22x) and the wiring portion 22b (22y) are arranged.

By arranging the via receiving electrode portions 22a, 22C (22x) whose width is narrower than the connection pad C under the connection pad C, the extra area can be used as the wiring area, and the wiring portion 22b (22y) can be arranged in addition.

Accordingly, the number of wirings can be increased without an introduction of the high-level photolithography technology. Therefore, a wiring density of the second wiring layers 22 can be easily increased.

Also, in the present embodiment, the via conductor VC2 whose diameter is smaller than the related art is divided into plural and then arranged. Therefore, a current density of individual via conductor VC2 can be reduced, and reliability of the via connection can be improved.

In the present embodiment, two wiring layers (the first and second wiring layers 20, 22) are stacked on both surface sides of the silicon substrate 10 respectively, and the connection pads C are provided on the upper surface side. In this case, the number of stacked wiring layers can be set arbitrarily to n layers (n is an integer in excess of 1). Also, the wiring layers and the connection pads may be formed only on one surface of the silicon substrate 10.

Also, the coreless type wiring substrate that does not have the core substrate may be employed. In this case, the coreless wiring substrate in which the insulating layer (resin) functions as the substrate can be obtained by forming the build-up wiring on the peelable temporal substrate, and then removing the temporal substrate from the build-up wiring.

Figure 3:
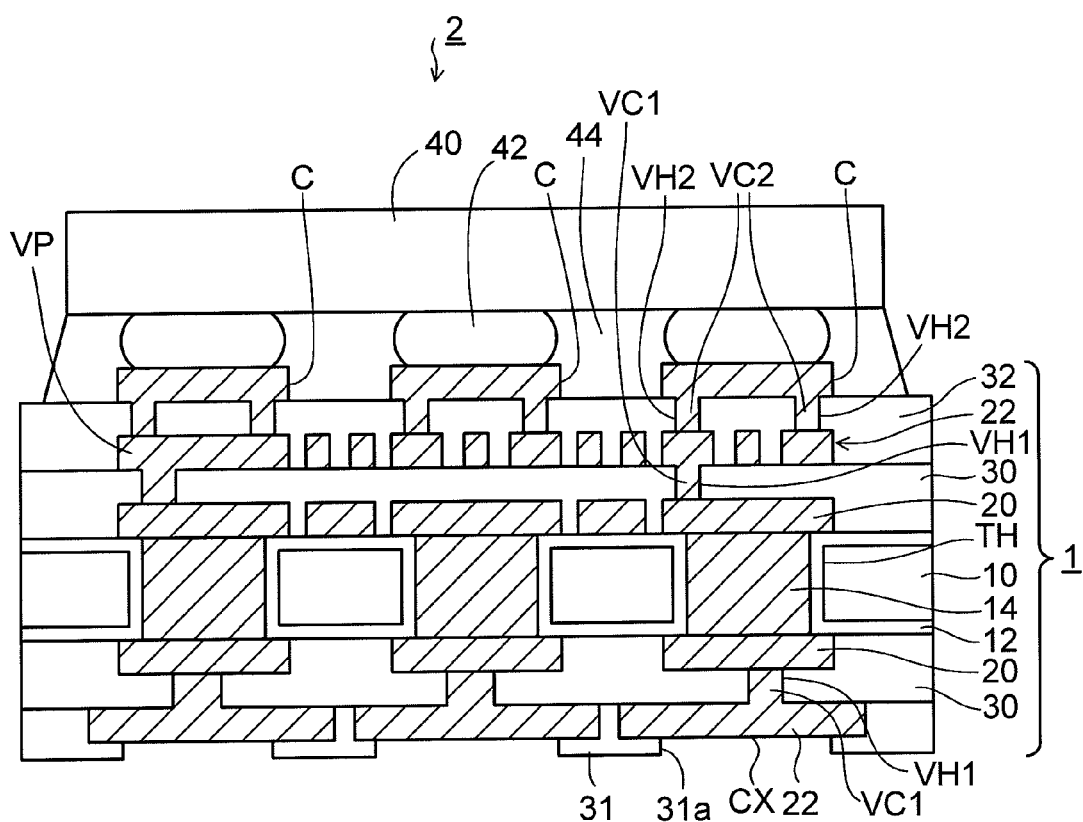
FIG. 3 is a sectional view depicting a semiconductor device according to the embodiment.

Next, a semiconductor device constructed by using the wiring substrate in the present embodiment will be explained hereunder. In FIG. 3, a semiconductor device 2 constructed by mounting a semiconductor chip on the above wiring substrate 1 is depicted. As depicted in FIG. 3, the semiconductor device 2 is constructed such that connection electrodes of a semiconductor chip 40 (LSI chip) are flip-chip connected to connection pads C (lands) of the wiring substrate 1 in FIG. 2 by bump electrodes 42.

For example, the connection electrodes of the semiconductor Chip 40 (LSI chip) are arranged on the solder balls which are temporarily bonded to the connection pads C of the wiring substrate 1, and then the reflow soldering is applied to the resultant structure. Thus, the semiconductor chip 40 is flip-chip connected to the wiring substrate 1. Then, an underfill resin 44 is filled into a clearance under the semiconductor chip 40.

Then, the external connection pads CX (lands) on the lower surface side of the wiring substrate 1 of the semiconductor device 2 are connected to the mounting substrate (motherboard). The semiconductor device 2 may be connected to the mounting substrate (motherboard) via the interposer.

Also, an external connection terminal which protrudes downwardly may be provided to the external connection pads CX on the lower surface side of the wiring substrate 1.

Figure 4:
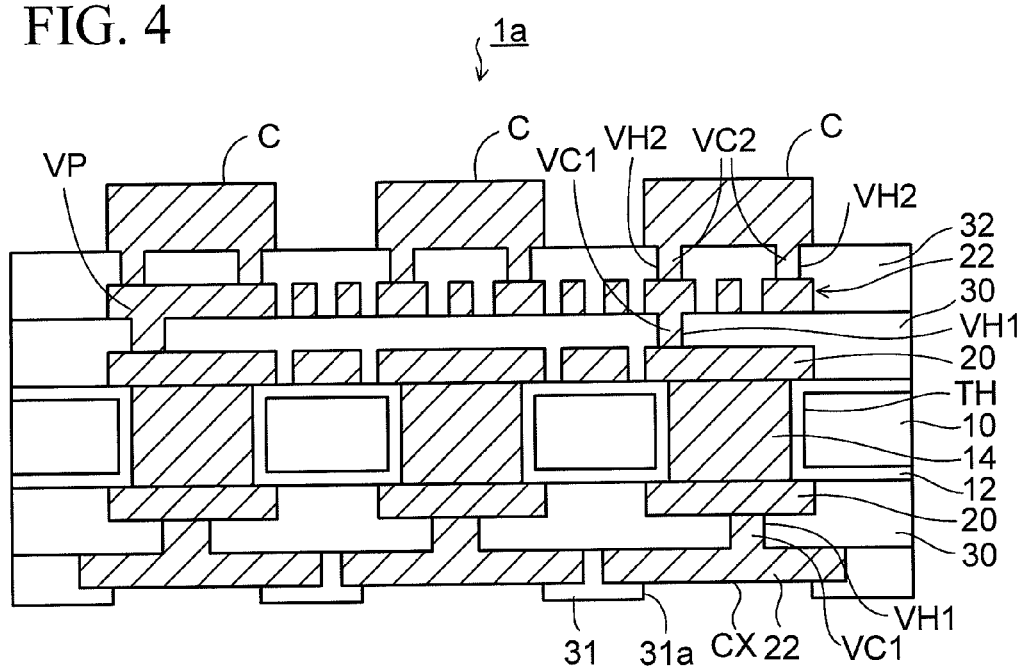
FIG. 4 is a sectional view depicting a wiring substrate according to a first variation of the embodiment.

In FIG. 4, a wiring substrate 1a according to a first variation of the embodiment is depicted. In the above wiring substrate 1 in FIG. 3, the connection pads C are formed as the lands whose thickness is equal to those of the first and second wiring layers 20, 22 (e.g., 2 to 3 μm). As in the wiring substrate 1a according to the first variation in FIG. 4, a thickness of the connection pad C may be set to about 15 μm, for example, and thus the connection pads C may be formed as the bump electrodes that are higher (thicker) than the thicknesses of the first and second wiring layers 20, 22.

By forming the connection pads C thickly as the bump electrodes, the electro migration resistance can be improved in the electric paths extended from the semiconductor chip 40 to the wiring substrate 1a (from the bump electrodes 42 (solders) to the connection pads C (copper)). In FIG. 4, other elements of the wiring substrate 1a are similar to those of the wiring substrate 1 in FIG. 3.

Figure 5:
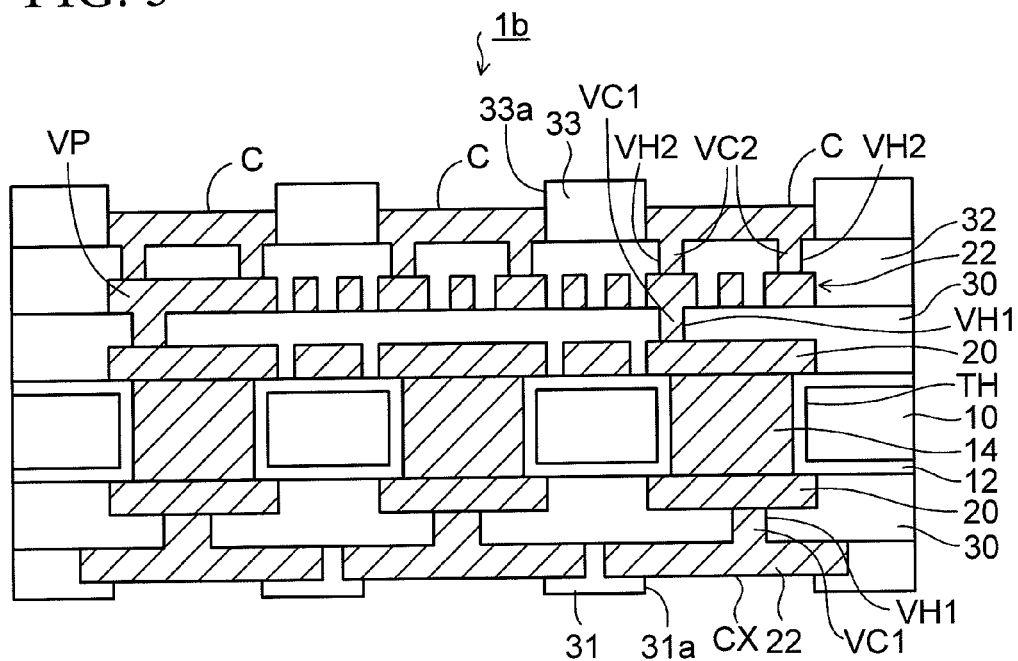
FIG. 5 is a sectional view depicting a wiring substrate according to a second variation of the embodiment.

In FIG. 5, a wiring substrate 1b according to a second variation of the embodiment is depicted. As in the wiring substrate 1b according to the second variation in FIG. 5, a solder resist 33 (insulating protection layer) in which opening portion 33a is provided on the connection pads C respectively may be formed on the upper surface side of the wiring substrate 1 in FIG. 3. In FIG. 5, other elements of the wiring substrate 1b are similar to those of the wiring substrate 1 in FIG. 3.

Also, in the wiring substrates 1a, 1b according to the first and second variations in FIG. 4 and FIG. 5, the semiconductor device is constructed similarly such that the semiconductor chip is flip-chip connected to the connection pads C of the wiring substrates 1a, 1b.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring substrate, comprising:
a wiring layer;
an insulating layer formed on the wiring layer;
a connection pad formed on the insulating layer; and
a via conductor formed to penetrate the insulating layer, and connecting the wiring layer and the connection pad;
wherein the wiring layer located under the connection pad is formed to have via receiving electrode portion whose area is smaller than an area of the connection pad, and a wiring portion separated from the via receiving electrode portion, in an area corresponding to the connection pad,
the via receiving electrode portion is connected to the connection pad via the via conductor,
the wiring portion is arranged to pass through the area corresponding to the connection pad, and
electrical connection is absent between the wiring portion with other wirings located at an upper side and lower side thereof, in the area corresponding to the connection pad.

2. A wiring substrate according to claim 1, wherein the via receiving electrode portion is arranged to be separated on both end sides of the area corresponding to the connection pad respectively, and the wiring portion is arranged between the via receiving electrode portions.

3. A wiring substrate according to claim 1, wherein the via receiving electrode portion is arranged on both end sides of the area corresponding to the connection pad respectively, and is extended from the area corresponding to the connection pad to an outer side, and is connected as one line on the insulating layer, and
the wiring portion is arranged between the via receiving electrode portions.

4. A wiring substrate according to claim 1, wherein the plural via conductors are arranged on the via receiving electrode portion.

5. A wiring substrate according to claim 1, wherein in an area corresponding to another connection pad formed on the same layer with the connection pad, the wiring layer located under the connection pad is formed to have a via pad whose size corresponds to a size of said another connection pad, and
the via pad is connected to said another connection pad via a plurality of via conductors whose diameter is same with the via conductor on the via receiving electrode portions.

6. A wiring substrate according to claim 1, wherein the wiring layer is formed in n layers (n is an integer of 1 or more) on one surface or both surfaces of a silicon substrate.

7. A wiring substrate according to claim 1, wherein the connection pad is formed as a bump electrode whose height is higher than a thickness of the wiring layer.

8. A semiconductor device, comprising:
the wiring substrate set forth in claim 1; and a semiconductor chip flip-chip connected to the connection pad of the wiring substrate.

* * * * *